United States Patent [19]

Hashizume et al.

[11] Patent Number: 4,958,158
[45] Date of Patent: Sep. 18, 1990

[54] MODEM WITH NOISE-REDUCING DECODER IN DEMODULATION OF ENCODED BINARY PULSE SIGNALS REPRESENTATIVE OF CONSTANT AMPLITUDE SIGNALS

[75] Inventors: Motomu Hashizume, Ichikawa; Yukoh Matsumoto, Tsukuba, both of Japan

[73] Assignee: Texas Instruments Incorporated, Dallas, Tex.

[21] Appl. No.: 184,318

[22] Filed: Apr. 21, 1988

[30] Foreign Application Priority Data

Apr. 22, 1987 [JP] Japan .................................. 62-99096

[51] Int. Cl.[5] ............................................. H03M 3/02
[52] U.S. Cl. ..................................... 341/143; 341/144; 375/34
[58] Field of Search .................... 341/55, 76, 143, 144; 325/27, 28, 34, 82, 99, 104

[56] References Cited

U.S. PATENT DOCUMENTS

| 3,292,086 | 12/1966 | Magnuski | 341/143 |
| 4,112,500 | 9/1978 | Peters | 341/143 |
| 4,544,911 | 10/1985 | Altman et al. | 341/144 |
| 4,703,308 | 10/1987 | Belcher | 341/144 |

FOREIGN PATENT DOCUMENTS

| 51634 | 3/1984 | Japan | 341/143 |
| 163937 | 9/1984 | Japan | 341/76 |
| 790296 | 12/1980 | U.S.S.R. | 341/143 |

Primary Examiner—William M. Shoop, Jr.
Assistant Examiner—Howard L. Williams
Attorney, Agent, or Firm—William E. Hiller; N. Rhys Merrett; Melvin Sharp

[57] ABSTRACT

Modem comprising a delta modulation (DM) encoder and a DM decoder which has noise-reducing capability in the demodulation of encoded binary pulse signals representative of constant amplitude signals. The DM decoder includes a 1-click delay circuit operable in conjunction with a logic circuit and an integrator to produce a demodulated output signal which is the same as the preceding signal when the input signals to the DM encoder are constant amplitude signals, thereby eliminating are substantially reducing granular noise arising from a constant analog input to the modem without requiring a special filter. The logic circuit of the DM decoder may be an exclusive NOR gate which compares the 1-clock delayed binary pulse signal with the binary pulse signal and provides a control signal output based upon the comparison. The control signal output from the exclusive NOR gate controls the output of the integrator and enables the integrator to produce a substantially noise-free demodulated output signal.

14 Claims, 5 Drawing Sheets

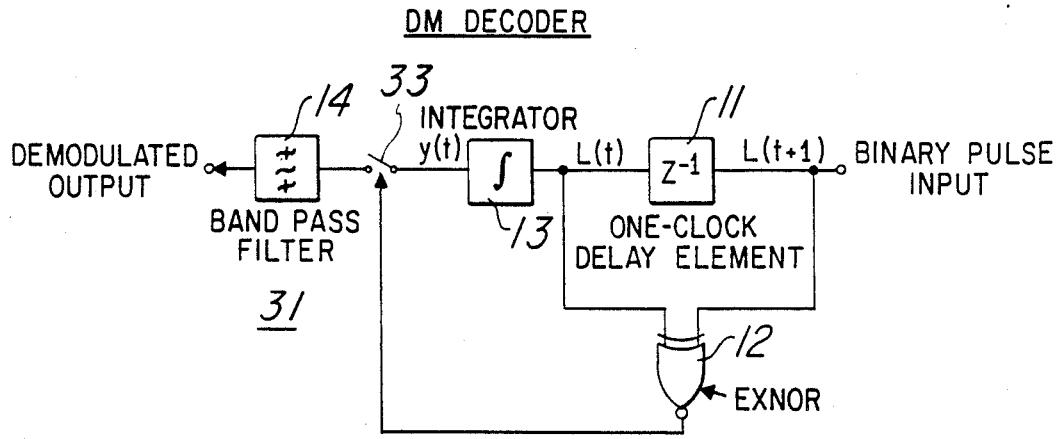
Fig. 4
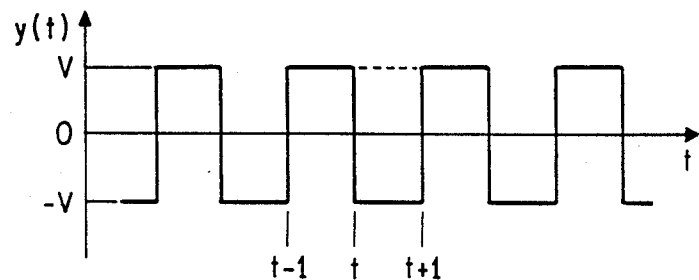
Fig. 5a
EXNOR
| INPUT | | OUTPUT |
|---|---|---|
| A | B | |
| 0 | 0 | 1 |
| 0 | 1 | 0 |
| 1 | 0 | 0 |
| 1 | 1 | 1 |
Fig. 5b

```
L[t]    1 1 1 0 1 0 1 0 1 0 1 0 ---

L[t+1]  1 1 0 1 0 1 0 1 0 1 0 1 ---

EXNOR
OUTPUT  1 1 0 0 0 0 0 0 0 0 0 0 ---
```

MODEM WITH NOISE-REDUCING DECODER IN DEMODULATION OF ENCODED BINARY PULSE SIGNALS REPRESENTATIVE OF CONSTANT AMPLITUDE SIGNALS

BACKGROUND OF THE INVENTION

1. Field of the Invention

The present invention relates to a modem.

2. Description of the Prior Art

The prior art delta modulation (DM) process converts a continuous signal into an alternating binary signal. This enables mass audio information to be stored in the form of compressed data by using sampled audio data techniques. In delta modulation, an audio signal under consideration at a first sample time is encoded as a logic "1" if the amplitude of the signal is less than that of the audio signal at the next sample time and as a logic "0" if the amplitude is higher.

The principle of DM encoding is exemplified by the prior art DM encoder 30 of FIG. 1 which includes a band pass filter 1; an adder 2; a digitizer 3; a one-clock delay circuit 4; and an integrator 5. The DM encoder 30 makes the comparison between an input value and a predicted value and then outputs a binary pulse having a DM value of either V or —V when the input signal changes to or from a logic "0". This single-bit encoding does not provide an allocation of a code for a continuous constant amplitude input signal.

The encoded signal is demodulated by a DM decoder 32 shown in FIG. 2 which includes an adder 6, a one-clock delay circuit 7, and a band pass filter 8. For a continuous constant amplitude input signal, it is unavoidable that the DM decoder 32 outputs a binary signal of the continuous one/zero alternating pattern showen in FIG. 3. This type of signal is an audio distortion called granular noise because it has an alternating digital pattern even though the input audio signal does not change. This granular noise is usually eliminated by an external low pass filter or a band pass filter.

An alternate method of reducing the noise is to reduce the sampling rate. For instance, dropping the sampling rate from 16 KBPS (kilobits per second) to 8 KBPS, reduces the frequency of the granular noise from 8 kHz to 4 kHz or ½ the sampling rate. However, the filter requirements still demand filters having steep response characteristics.

OBJECTS AND SUMMARY OF THE INVENTION

An object of the present invention is to provide a modem that efficiently eliminates or reduces noise from output signals without requiring filters having special response characteristics.

In order to achieve the above-mentioned object, one embodiment of the invention is implemented by a modem that includes a DM encoder and a DM decoder that provides output signals having the same amplitude if at the decoding time the amplitude of the preceding signal is equal to the amplitude of the succeeding signal.

Other objects, features and advantages of the invention will become more apparent from the following detailed description of the invention taken in consideration with the accompanying drawings in which:

BRIEF DESCRIPTION OF THE DRAWINGS

FIG. 4 is a block diagram of a decoder according to the invention;

FIG. 5a is a graph representing a pulse train output from the decoder of FIG. 4;

FIG. 5b is a truth table of the Exclusive NOR gate of FIG. 4;

DESCRIPTION OF THE PREFERRED EMBODIMENTS

Figure 1:
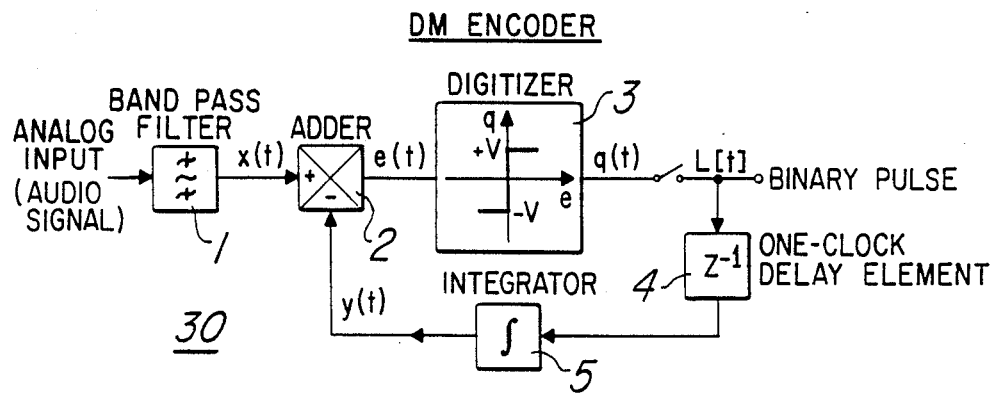
FIG. 1 is a block diagram of a prior art DM encoder.

FIG. 4 illustrates a decoder 31 according to the invention which should be used in conjunction with an encoder such as shown in FIG. 1 in which an audio analog signal is supplied to the DM encoder 30. The DM encoder 30 encodes the audio analog signal and provides a binary pulse output signal that when applied to the DM decoder 31 of FIG. 4 is demodulated. The Exclusive NOR gate (EXNOR) 12 receives a binary pulse input on one terminal and on the other terminal a one-clock delay pulse input that has been time delayed by delay element $Z^{-1}$ 11, and outputs a control signal that controls the output of the integrator 13. Band pass filter 14 is connected to the switch 33 on the output of the integrator 13.

Referring to FIG. 5, the decoder 31 is dependent on the action of the EXNOR gate 12 to output a signal, y(t), when the amplitude of a preceding signal, y(t−1), is the same as the amplitude of succeeding input data signal, y(t+1). The one-clock delayed decoded signal is the signal at time y(t−1) as is indicated by the dashed line on FIG. 5a. This process is effective in eliminating the graanular noise when the input signals are constant amplitude signals at the sample times of y(t+1) and y(t−1).

The control of the switch 33 is accomplished by the operation of the EXNOR gate 12 as noted in the truth table of in FIG. 5b and is as follows: at a time point under consideration "t", a transition in the amplitude of the input binary pulse stream from a −V to V, causes a logic "1" to be provided as the output of the EXNOR gate 12; and a transition from a V to −V, will cause a logic "0" to be provided as the output from the EXNOR gate 12. This is due to the fact that a logic "1" and logic "0" are the inputs to the EXNOR gate 12. The output, y(t), is the same as y(t−1). When the input varies, for instance, increases with time, two logic "1's" are the inputs to the EXNOR gate 12 and its output is also a logic "1", thus the switch 33 is operated and y(t) is provided to the bandpass filter and the circuit operates in the same way as in the prior art.

Figure 2:
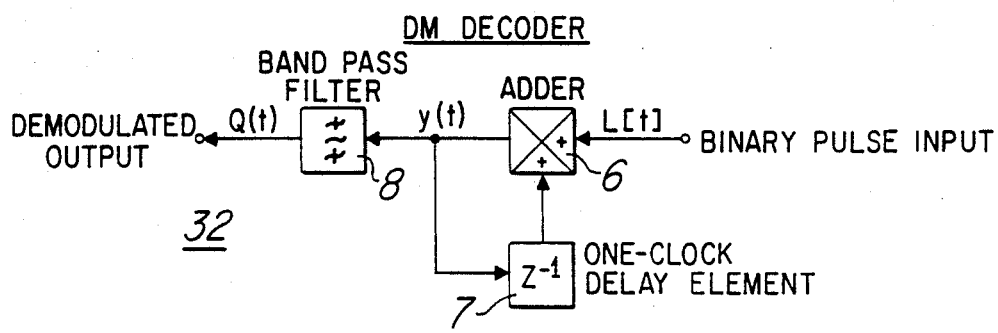
FIG. 2 is a block diagram of a prior art DM decoder.
Figure 3:
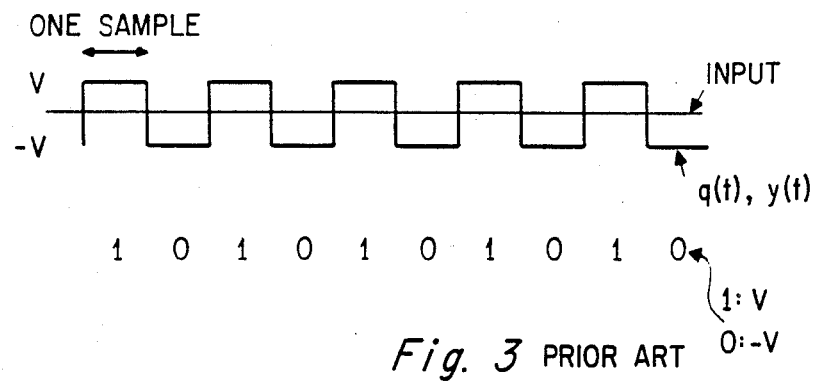
FIG. 3 is a graph representing a pulse train of granular noise and the corresponding binary code pattern as provided by the output from the prior art DM decoder of FIG. 2.
Figure 6:
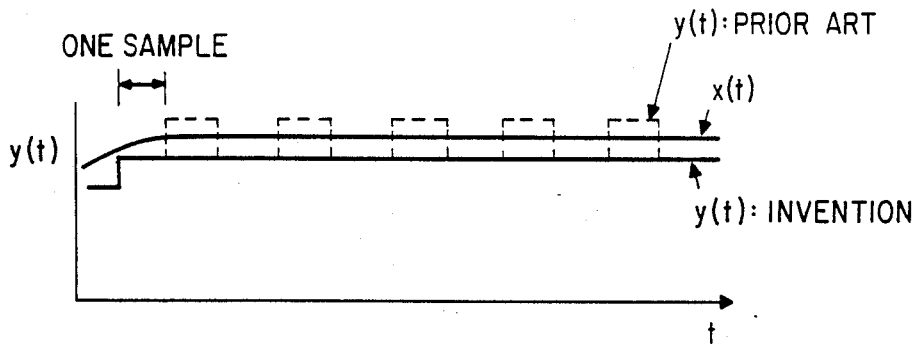
FIG. 6 is a waveform diagram illustrating the difference in the outputs of the prior art DM decoder and the decoder of the invention.

FIG. 6 reveals that the embodiment of FIG. 4 can respond to a constant audio input x(t) and provide as an output a virtually constant signal y(t) that is substantially free of granular noise which was unavoidable in the prior art embodiment of FIG. 2.

Figure 7:
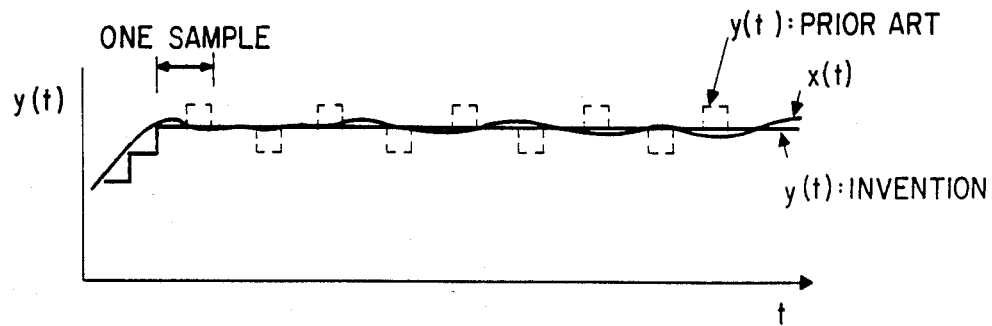
FIG. 7 is a waveform diagram illustrating the difference in the outputs of the prior art DM decoder and the decoder of the invention when the sampling rate is double that used for FIG. 6.

FIG. 7 illustrates what happens to the x(t) and y(t) signals when the sampling rate is double that rate used to generate the response curves of FIG. 6. This shows an even more obvious advantage in the performance of the invention.

Figure 8:
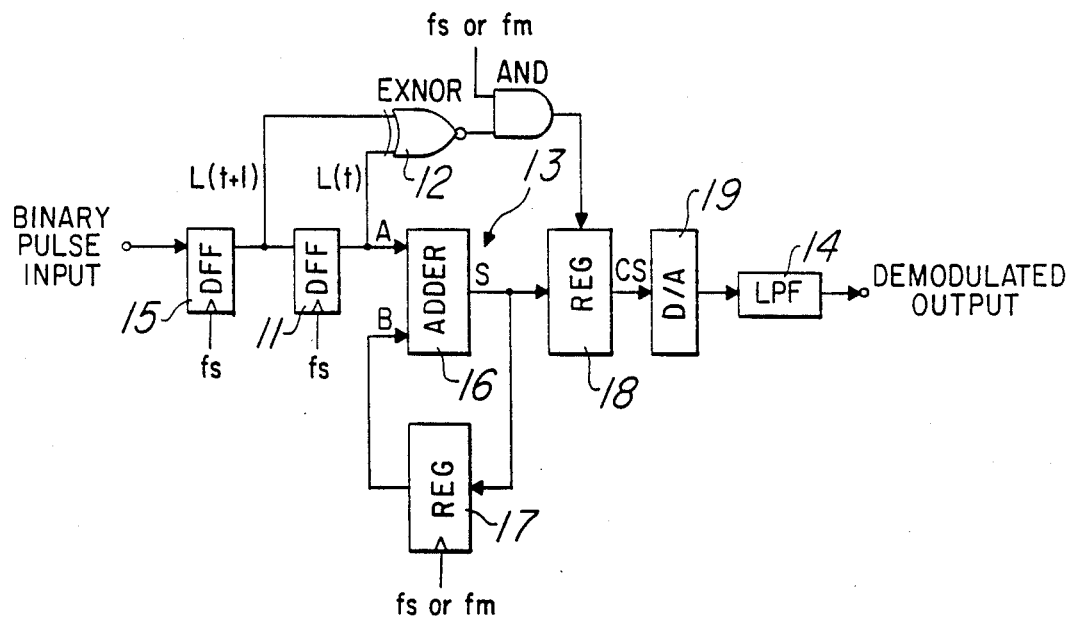
FIG. 8 is a block diagram of the decoder of the invention represented in detail.
Figure 9:
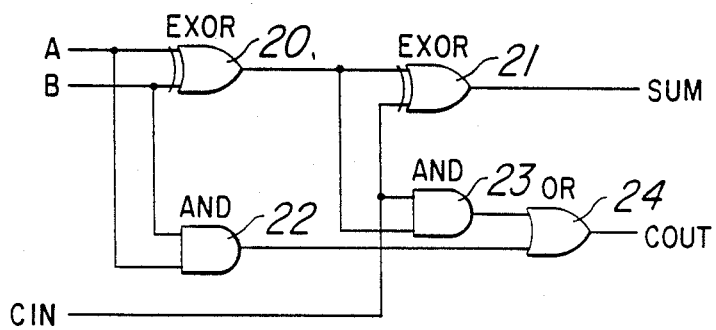
FIG. 9 is a logic diagram of the adder of FIG. 8.

FIG. 8 is a schematic diagram of the suppressed carrier demodulator of FIG. 4. In FIG. 8 the following abbreviations are used: DFF, a D-type flip-flop; ADDER, an adder; REG, a register; D/A, a D/A converter; LPF, a low pass filter; fm, calculation master frequency (=1/Tm, Tm: calculation master time period); and $f_s$, sampling frequency. The one-clock delay element 11 (FIG. 4) comprises a DFF, and the integrator 13 (FIG. 4) is composed of an ADDER and a REG. Circuit components of the decoder diagrammed in FIG. 9 EXNOR's 20, 21, AND's 22, 23, and a OR 24 are known in the art and will not be described in detail here. An exception is the ADDER 16 which is illustrated in FIG. 9, and includes a one bit input; a one bit output; a carry out, $C_{out}$; and a carry in, $C_{in}$. A, B, and $S_{nm}$ in FIG. 9 correspond to A, B and predicted value S in FIG. 8, respectively.

The operational functions of the components in the embodiment of FIG. 8 are as follows:

1. The first DFF 15 synchronizes the binary pulse input with the sampling frequency $f_s$ that is dependent on the internal clock (not shown).
2. The second DFF 11 delays the input binary pulse one $f_s$ clock and thus enables a comparison to be made between the preceding one-sample earlier binary pulse and the synchronized binary pulse.
3. ADDER 16 provides as an output a predicted binary signal S which is generated from the binary input A of ADDER 16 and the output B of REG 17 which is the stored preceding output (predicted binary signal S) from the ADDER 16.
4. EXNOR gate 12 detects transitions and continuations of data, and if a transition is detected, the write enable on REG 18 is disabled for a sample clock, $f_s$, period and the binary data previously stored therein is held for one sample clock period. If a data continuation is detected, write enable is applied to REG 18.
5. D/A converter 19 translates demodulated digital signals into analog signals.
6. The low pass filter 14 eliminates noise, such as the noise due to the sampling for encoding.

Figure 10:
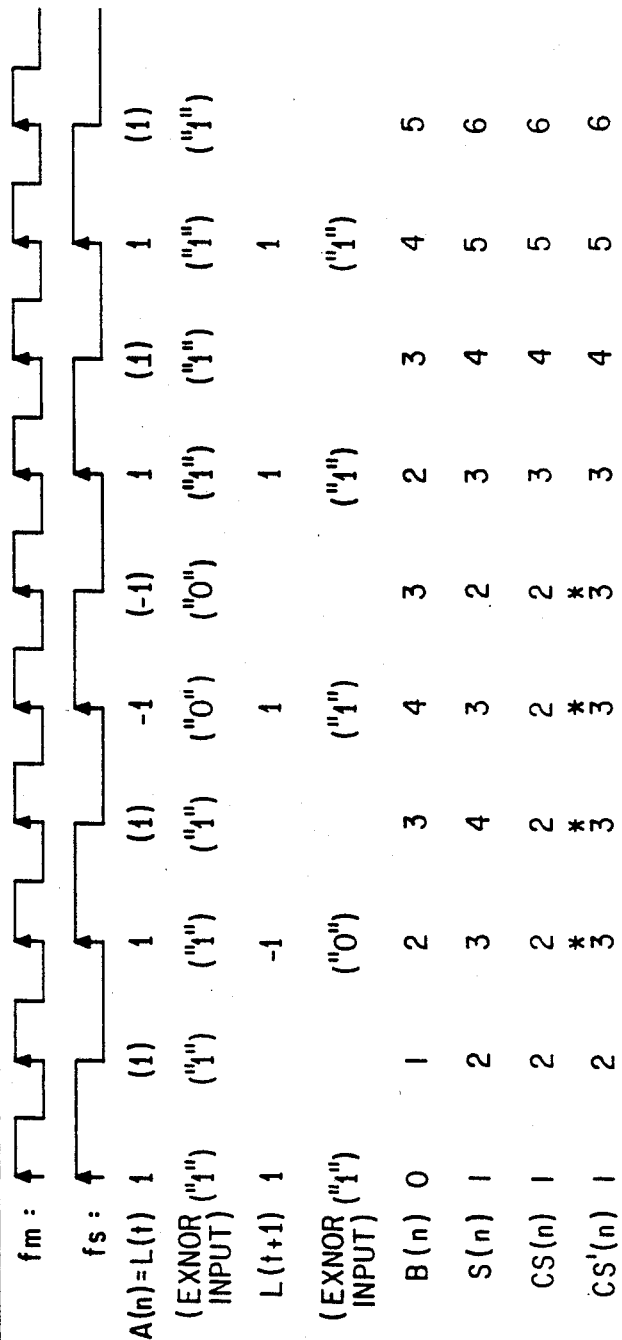
FIG. 10 is a waveform diagram of a pulse stream from the decoder of FIG. 8, and includes a table having signal values taken at different locations within the decoder of FIG. 8.

FIG. 10 shows the circuit response of the decoder of FIG. 8. Over-sampling is performed at frequency fm, where fm is double the original sampling frequency $f_s$. In FIG. 10, fm is the wave form of the calculation clock, and $f_s$ is the wave form of the sampling clock respectively. Assuming that sampling is made at the rising edge of $f_s$ and the outputs of the DFF's L(t+1) and L(t) change at the rising edge of the sampling clock then L(t), A(n) and (EXNOR's input)−1; L(t+1), (EXNOR's other input)=1, and B(n)=S(n−1)=0; and S(n)=A(n)+B(n)=1, CS(n)=S(n)=1, and CS'(n)=1. Because of over sampling, the subsequent inputs A(n)=1 (the same as the preceding signal), B(n)=1, S(n)=2, CS(n)=2, CS(n)=2, and CS'(n)=2.

If L(t+1)=−1, then L(t)=1 because it corrresponds to L(t+1) at the preceding sampling. CS therefore remains at the preceding state, and thus B(n)=2, S(n)=3, and CS(n)=2.

By selectively repeating these procedures, noiseless demodulated output can be obtained.

As understood from the above, the modem according to the invention produces a stable high quality output from which granular noise is eliminated or reduced, thus eliminating the requirement of an external special filter. On the other hand, when voice signals are the input signal, a reduction of noise arising from ½ frequency of the sampling frequency is possible.

In this way, the DM modem according to the invention is useful especially for suppressed carrier communications.

It will be evident that various modification can be made to the described embodiment without departing from the scope of the present invention.

For example, the construction and circuit components of the above-mentioned decoder can be changed or modified in various ways. The term used herein "DM modulation" should not be limited and embraces such as adaptive delta modulation (ADM) and adaptive pulse code modulation (ADPCM). It is a matter of course that different sampling rates may be applied.

The present invention has the feature that the output signal at a time point under consideration is the same as the preceding signal when the preceding signal is equal to the succeeding signal, and thus the advantage resides in permitting granular noise arising from a constant analog input to be efficiently eliminated or reduced without needing a special filter.

What is claimed is:

1. A modem comprising:
    delta modulation encoder means for receiving an analog input signal and providing an encoded binary pulse signal output; and
    delta modulation decoder means operably connected to said encoder means, said decoder means including:
        one-clock delay means for receiving the encoded binary pulse signal as an input and delaying said binary pulse signal input one-clock pulse to provide a delayed binary pulse signal as an output therefrom,
        logic means having respective inputs connected to the input and to the output of said one-clock delay means for comparing the binary pulse signal input to the delayed binary pulse signal and producing a control signal as an output in response thereto, and
        integrator means having an output connected to the output of said logic means and controlled thereby for providing a demodulated output signal from the decoder means in dependence upon a control signal provided by said logic means.

2. A modem as set forth in claim 1, wherein said logic means comprises an exclusive NOR logic gate having first and second inputs for respectively receiving the binary pulse signal input and the delayed binary pulse signal from the input and the output of said one-clock delay means and producing an enabling control signal as an output to enable the output of said integrator means for transmitting a demodulated output signal at a time instant of decoding which is the same as the preceding demodulated output signal when the preceding demodulated output signal is equal to the succeeding demodulated output signal for providing a substantially noise-free demodulated output signal when the analog input signal to said encoding means is a constant amplitude signal.

3. A modem as set forth in claim 2, wherein the data y(t) of the demodulated output signal at said time instant of decoding is the same as the data y(t−1) of the preceding demodulated output signal when the data y(t−1) of the preceding demodulated output signal is equal to the data y(t+1) of the succeeding demodulated output signal.

4. A modem as set forth in claim 3, wherein said one-clock delay means comprises a flip-flop circuit for delaying the transmission of the binary pulse signal input therethrough one-clock cycle to a delayed binary pulse signal output.

5. A modem as set forth in claim 3, wherein said integrator means comprises an adder circuit having a first input for receiving the delayed binary pulse signal output from said one-clock delay means;
   a first register operably connected to the output of said adder circuit via a feed-back line and providing an output as a second input to said adder circuit;
   a second register connected to the output of said adder circuit and to the output of said exclusive NOR logic gate for holding the output of said adder circuit in dependence upon a control signal at one logic state from said exclusive NOR logic gate and transmitting the output of said adder circuit in dependence upon a control signal at the other logic state from said exclusive NOR logic gate; and
   digital-analog converter means connected to the output of said second register for transforming the demodulated digital data output therefrom into a demodulated analog signal output reprdocing the analog input signal as received by said encoder means.

6. A modem as set forth in claim 5, further including bandpass filter means connected to the output of said digital-analog converter means for removing noise from the demodulated analog signal output to provide a substantially noise-free demodulated analog signal as an output.

7. A modem as set forth in claim 5, wherein said adder circuit comprises:
   first and second stages respectively including an exclusive OR logic gate and an AND logic gate connected in parallel and having respective first and second inputs;
   the first and second inputs of said exclusive OR logic gate and said AND logic gate of said first stage respectively receiving the output of said one-clock delay means and the output of said first register;
   said exclusive OR logic gate and said AND logic gate of said second stage respectively receiving the output of said exclusive OR logic gate of said first stage at a first input thereof and a carry-in signal at the second input thereof; and
   an OR logic gate having first and second inputs respectively receiving the outputs of said AND logic gates of said first and second stages and providing a carry-out signal as an output therefrom;
   said exclusive OR logic gate of said second stage providing at its output a predicted value of the sum from said adder circuit.

8. A decoder for providing a demodulated output signal by employing a delta modulation technique, said decoder comprising:
   one-clock delay means for receiving and encoded binary pulse signal as an input and delaying said binary pulse signal input one-clock pulse to provide a delayed binary pulse signal as an output therefrom;
   logic means having respective inputs connected to the input and to the output of said one-clock delay means for comparing the binary pulse signal input to the delayed binary pulse signal and producing a control signal as an output in response thereto; and
   integrator means having an output connected to the output of said logic means and controlled thereby for providing a demodulated output signal in dependence upon a control signal provided by said logic means.

9. A decoder as set forth in claim 8, wherein said logic means comprises an exclusive NOR logic gate having first and second inputs for respectively receiving the binary pulse signal input and the delayed binary pulse signal from the input and the output of said one-clock delay means and producing an enabling control signal as an output to enable the output of said integrator means for transmitting a demodulated output signal at a time instant of decoding which is the same as the preceding demodulated output signal when the preceding demodulated output signal is equal to the succeeding demodulated output signal for providing a substantially noise-free demodulated output signal when the binary pulse signal input received by said one-clock delay means represents an analog signal of constant amplitude.

10. A decoder as set forth in claim 9, wherein the data y(t) of the demodulated output signal at said time instant of decoding is the same as the data y(t−1) of the preceding demodulated output signal when the data y(t−1) of the preceding demodulated output signal is equal to the data y(t+1) of the succeeding demodulated output signal.

11. A decoder as set forth in claim 10, wherein said one-clock delay means comprises a flip-flop circuit for delaying the transmission of the binary pulse signal input therethrough one-clock to a delayed binary pulse signal output.

12. A decoder as set forth in claim 10, wherein said integrator means comprises an adder circuit having a first input for receiving the delayed binary pulse signal output from said one-clock delay means;
   a first register operably connected to the output of said adder circuit via a feed-back line and providing an output as a second input to said adder circuit;
   a second register connected to the output of said adder circuit and to the output of said exclusive NOR logic gate for holding the output of said adder circuit in dependence upon a control signal at one logic state from said exclusive NOR logic gate and transmitting the output of said adder circuit in dependence upon a control signal at the other logic state from said exclusive NOR logic gate; and
   digital-analog converter means connected to the output of said second register for transforming the demodulated digital data output therefrom into a demodulated analog signal output.

13. A decoder as set forth in claim 12, further including bandpass filter means connected to the output of said digital-analog converter means for removing noise from the demodulated analog signal output to provide a substantially noise-free demodulated analog signal as an output.

14. A decoder as set forth in claim 12, wherein said adder circuit comprises:
   first and second stages respectively including an exclusive OR logic gate and an AND logic gate connected in parallel and having respective first and second inputs;
   the first and second inputs of said exclusive OR logic gate and said AND logic gate of said first stage respectively receiving the output of said one-clock delay means and the output of said first register;
   said exclusive OR logic gate and said AND logic gate of said second stage respectively receiving the output of said exclusive OR logic gate of said first stage at a first input thereof and a carry-in signal at the second input thereof; and
   an OR logic gate having first and second inputs respectively receiving the outputs of said AND logic gates of said first and second stages and providing a carry-out signal as an output therefrom;
   said exclusive OR logic gate of said second stage providing at its output a predicted value of the sum from said adder circuit.

* * * * *